(12) United States Patent  (10) Patent No.: US 8,456,857 B2
Gröschner et al.  (45) Date of Patent: Jun. 4, 2013

(54) BACKPLANE FOR AN ELECTRONIC MOUNTING RACK

(75) Inventors: Uwe Gröschner, Metzels (DE); Falk Steiner, Suhl (DE); Stefan Asch, Puchheim (DE)

(73) Assignee: ADVA Optical Networking SE, Meiningen (DE)

( * ) Notice: Subject to any disclaimer, the term of this patent is extended or adjusted under 35 U.S.C. 154(b) by 618 days.

(21) Appl. No.: 12/293,777

(22) PCT Filed: Mar. 21, 2007

(86) PCT No.: PCT/DE2007/000526
§ 371 (c)(1),
(2), (4) Date: Mar. 31, 2010

(87) PCT Pub. No.: WO2007/110053
PCT Pub. Date: Oct. 4, 2007

(65) Prior Publication Data
US 2010/0214755 A1  Aug. 26, 2010

(30) Foreign Application Priority Data

Mar. 22, 2006 (DE) .......................... 10 2006 013 206

(51) Int. Cl.
*H05K 1/11* (2006.01)

(52) U.S. Cl.
USPC ........... 361/784; 361/785; 361/788; 361/790; 361/792; 361/794

(58) Field of Classification Search
USPC .................. 361/784, 785, 788, 790, 792, 794
See application file for complete search history.

(56) References Cited

U.S. PATENT DOCUMENTS

| 5,269,693 | A | * | 12/1993 | Sekine ........................... 439/74 |
| 5,896,473 | A | | 4/1999 | Kaspari |
| 6,349,037 | B1 | | 2/2002 | Draughn et al. |
| 6,757,177 | B2 | * | 6/2004 | Harris et al. .................. 361/788 |
| 2002/0090844 | A1 | * | 7/2002 | Kocin ............................. 439/74 |
| 2005/0207134 | A1 | | 9/2005 | Belady et al. |

FOREIGN PATENT DOCUMENTS

| CA | 2354181 A1 | 1/2003 |
| EP | 1 221 829 A | 7/2002 |
| WO | WO 03/005790 A | 1/2003 |

\* cited by examiner

*Primary Examiner* — Tuan T Dinh
*Assistant Examiner* — Hung Dang
(74) *Attorney, Agent, or Firm* — The Culbertson Group, P.C.

(57) ABSTRACT

A backplane arrangement is provided for an electronic mounting rack with a base backplane with several contact strips, wherein a free space, into which at least one additional backplane can be inserted, is provided on the base backplane.

1 Claim, 3 Drawing Sheets

BACKPLANE FOR AN ELECTRONIC MOUNTING RACK

TECHNICAL FIELD OF THE INVENTION

The invention relates to a backplane for an electronic mounting rack. In the field, circuit boards or bus conductor panels, into which modules in the form of plug-in cards are inserted and contacted and which are arranged on the rear wall of a mounting rack, are generally referred to as backplanes. Inserted modules can thereby communicate with one another, be supplied with a voltage, etc.

BACKGROUND OF THE INVENTION

Such backplanes are therefore widely used in data processing technology, for instance in server racks, distribution stations, telecommunications equipment (stations), machine controllers and so on.

Given the rapid progress of technology, however, the demands placed on electronics are increasingly changing, so that after the introduction or design and installation of a backplane, the data, communications and supply lines set up by it are often confronted with new tasks in the near future.

In order to meet additional, unforeseeable future requirements, additional supply lines, not currently connected, are generally provided. If a new requirement arises for introduction of the backplane into the product, or for installation in the mounting rack, the reserve lines are examined as to whether they can meet the requirement.

As a rule, however, it is a disadvantage that reserve lines can satisfy only relatively simple subsequent demands. Higher requirements, such as for high-speed transmission lines, more powerful supply lines and so on, generally overtax the possibilities of the reserve provided by the number of free reserve lines. It is a disadvantage that a fundamental redesign of the system, and thus a cost-intensive new product, is required in such a case. Thus, it is impossible, for example, with the existing, installed backplanes to implement a new plug-connector generation that did not exist at the time the backplane was manufactured, but that meets new high-speed requirements.

SUMMARY OF THE INVENTION

The present invention provides a solution to the problem of creating a backplane that avoids the above-mentioned disadvantages and meets future requirements, so that a cost-intensive new development or redesign of a new backplane can be avoided.

By providing a free space on the actual backplane, referred to below as the base backplane, at least one additional backplane can be inserted into such a free space. Such a free space can be constructed in a great variety of shapes. For example, the additional backplane could simply be placed on a part of the preferably flat surface of the base backplane, i.e., doubled up. It is also contemplated to provide a socket or a depression in the base backplane that is at least the size of the additional backplane. In this regard is contemplated for the depression to be a recess (by means of milling, for example), preferably in the thickness of the additional backplane, so that a space-saving countersinking of the backplane is possible, in addition to a lateral fixation. It is of course also contemplated to construct the free space as a through-going recess, i.e., a hole, or to subdivide the base backplane appropriately, the term base backplane including, but not limited to, according to the invention, the entirety of a possibly subdivided base backplane. An example of such a through-going recess, or hole, is shown in FIG. 3, as recess 31. In any case, the provision on the backplane of a free space, which must by nature be smaller than the dimensions of the base backplane, can provide not only a contacting of the optional contact strips of the additional backplane, but also the contacting of the base backplane's contact strips when the module is inserted.

An additional advantage of some arrangements herein is that an additional backplane can be inserted on the front side, and the mounting rack need not be removed from its installation environment.

In a preferred implementation, this free space is provided on the upper side of the backplane on which the contact strips of the base backplane for contacting the plug-in cards or their complementarily constructed contacts are located. In this way, the free space advantageously lies in the insertion direction of the plug-in cards, i.e., accessible from the front or from above for example, so that a laborious opening of the back side or other closed walls of the mounting rack or its housing, or a dismantling of an installed base backplane, is not necessary for inserting, removing or replacing the additional backplane.

In an additional configuration of the invention, the contact strips of the additional backplane and the contact strips of the base backplane are arranged in a space-saving manner parallel with respect to their longitudinal directions, preferably aligned, when the additional backplane is inserted. In this way, the space available can advantageously be optimally put to use to arrange a plurality of contact strips both on the base backplane and on the additional backplane.

In a preferred configuration of the invention, the free space is formed as at least one intermediate space in the longitudinal direction of the base backplane's contact strips, so that the at least one additional backplane inserted therein lies inside the outer longitudinal dimension and possibly also inside the lateral dimension of the base backplane's contact strips. Thereby a symmetrical pressure distribution on the respective contact strip during the insertion of a module can advantageously be assured independently of the insertion of the additional backplane, and an undesired tilting can be avoided.

In a further configuration of the invention, the contact strips of the additional backplane are formed complementarily to the contact strips of a module to be contacted, particularly in their overall height extending from the surface, so that when such a module is inserted into the mounting rack, the corresponding, complementarily constructed contact strips of the module are preferably simultaneously connected electrically, and possibly mechanically as well, by means of corresponding guides. In this manner, the resulting pressure or force acting on the contact strips can be distributed more uniformly, so that potential damage due to excessive mechanical stress can be prevented.

Moreover, a supply terminal, in the form of a plug connection for instance, can be provided on the base backplane. Thereby the additional backplane can be connected electrically in a simple manner. It is also conceivable, of course, to connect the additional backplane electrically by means, for example, of a corresponding plug-in card or a double contact strip via the contact strip or strips of the base backplane.

In an additional configuration of the invention, the base backplane and/or the additional backplane has mounting means for mounting, preferably detachably, an additional backplane inserted into the free space. In this regard, an extremely wide variety of suitable mounting means are conceivable such as threaded connections, plug connections, spring elements, cutouts that can be clipped onto catches, projections or catch tabs, and so on. The mounting means can be arranged on the base backplane and/or the additional backplane, wherein in particular a combination of complementarily constructed mounting means is possible.

With the additional backplane inserted, the arrangement functions overall as a backplane that is both mechanically and electrically homogeneous, it being naturally conceivable not to mount the additional backplane only on a flat surface of the base backplane, preferably detachably; instead, other forms as described above are possible.

Additional advantageous configurations of the invention are found in the dependent claims and the following description. The invention is described in detail below with reference to an embodiment illustrated in the drawings.

DETAILED DESCRIPTION

Figure 1:
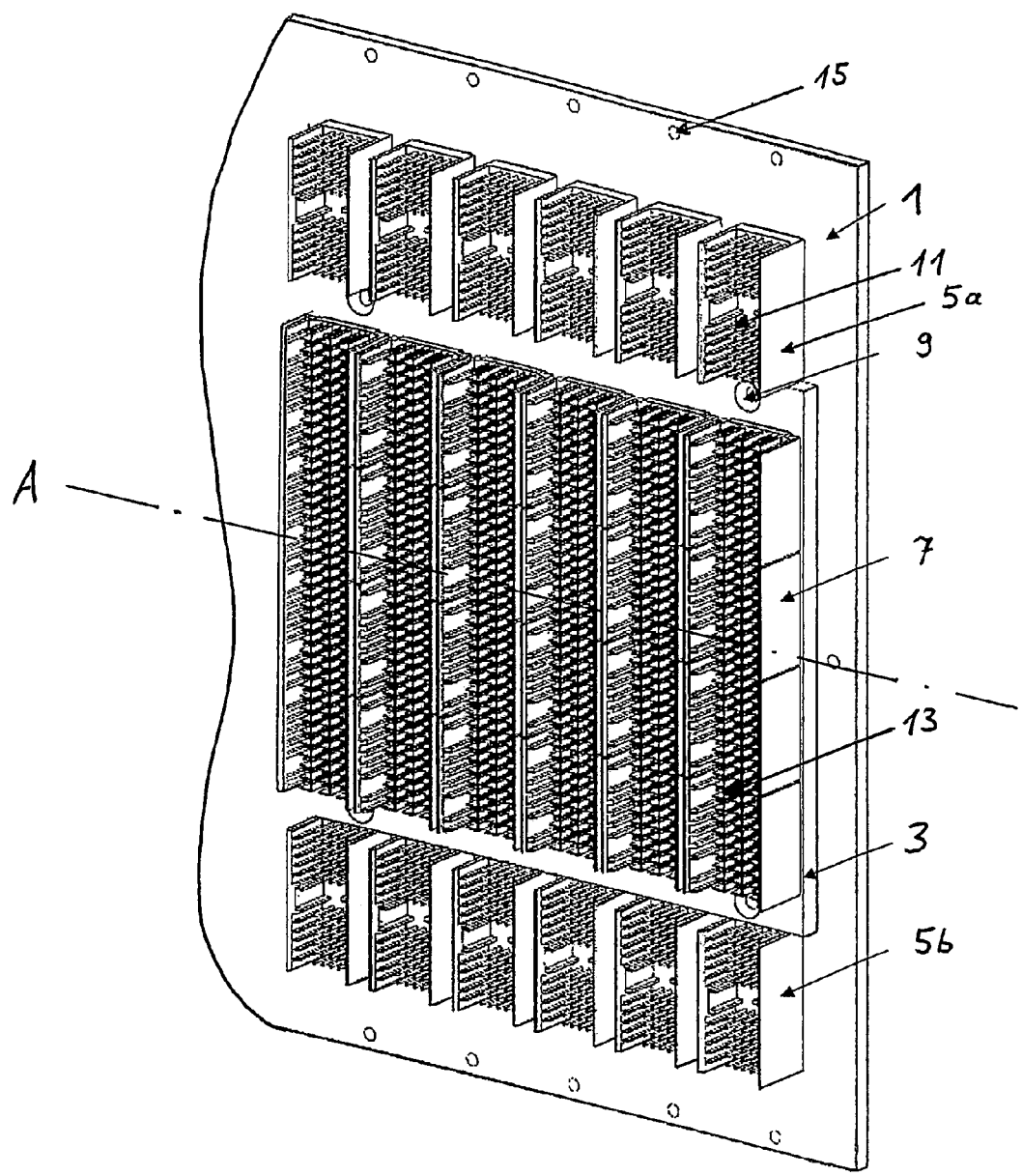
FIG. 1 shows a perspective partial view onto a base backplane according to the invention with inserted additional backplane, and FIG. 2 a side view onto a base backplane with inserted additional backplane according to FIG. 1.

The arrangement illustrated in FIG. 1 shows how an additional backplane 3 is inserted into a free space of a base backplane 1.

The base backplane here has a contact strip in the form of an upper contact strip 5a and a lower contact strip 5b, between which the free space is formed into which the additional backplane 3 can be inserted or has been inserted, as in FIG. 1.

Figure 2:
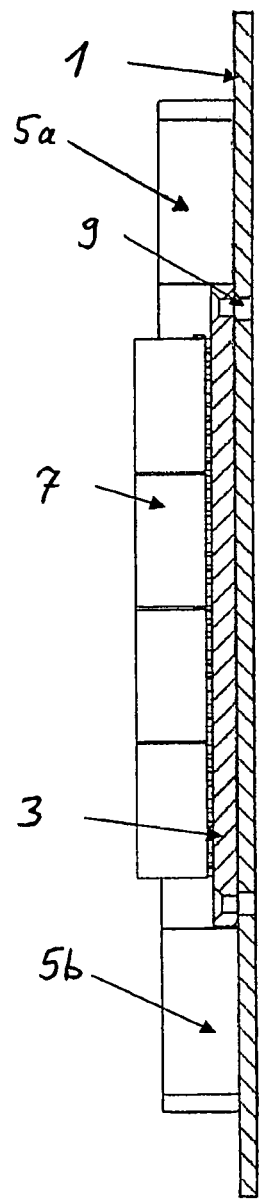
Figure 3:
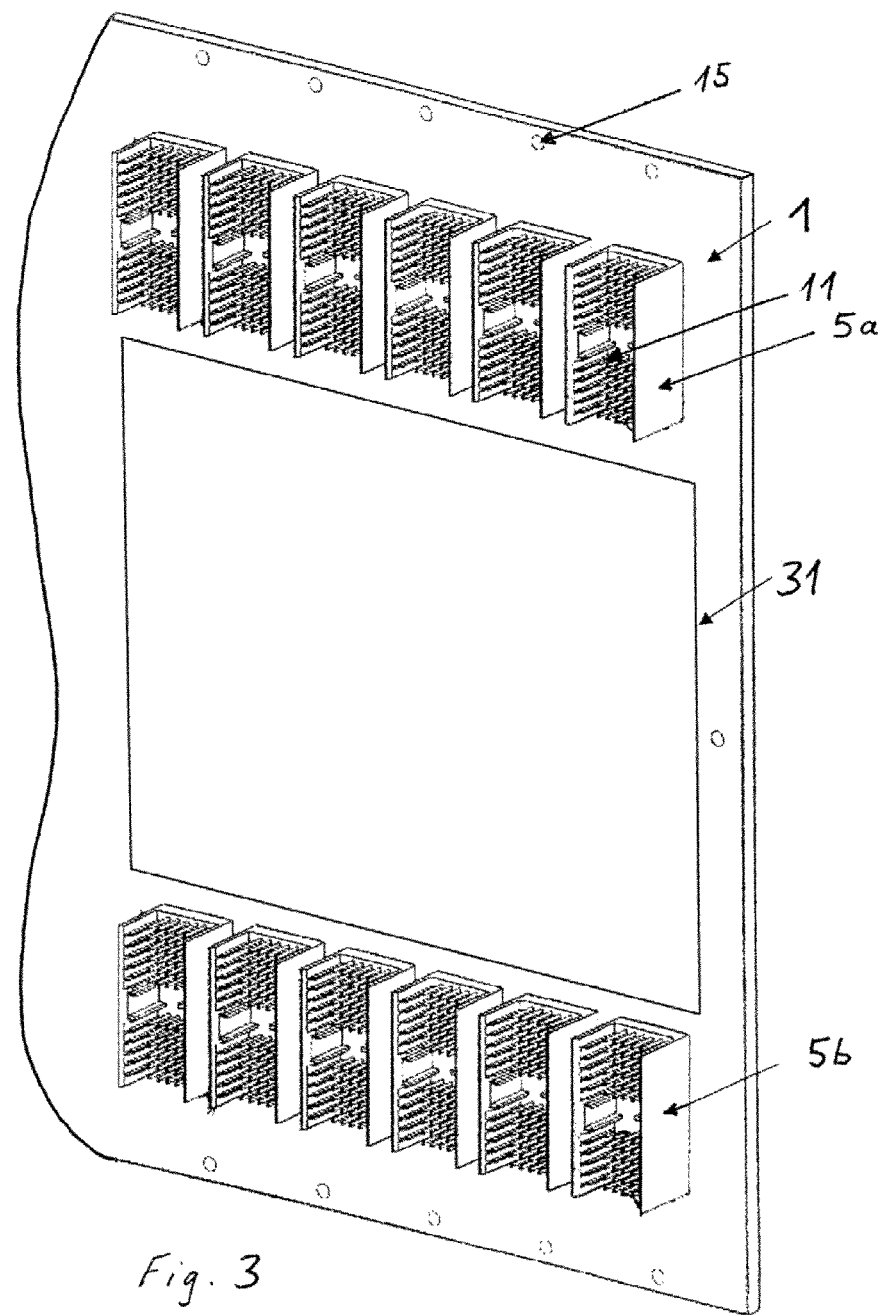
FIG. 3 is a perspective view of an alternative embodiment similar to that in FIG. 1, including a through-going recess into which may be mounted an additional backplane.

As is visible from FIG. 2, the additional backplane 3 here is doubled up on the base backplane 1 or arranged on a flat surface of the base backplane 1. Threaded connections, preferably with countersunk screws as shown, can serve here as mounting means that detachably mount the additional backplane 3 on the base backplane 1 in the threaded holes provided for that purpose.

As is evident in FIG. 1, the additional backplane 3 has contact strips 7 which, like the contact strips 5a, 5b of the base backplane 1 have a longitudinally elongated shape.

In the preferred embodiment of the invention represented in the drawing, the contact strips 7 of the additional backplane 3 are aligned with the contact strips 5a and 5b of the base backplane 1 in their longitudinal direction or longitudinal extent, it being naturally also conceivable for the contact strips 7 to be arranged parallel to the contact strips 5a, 5b in the longitudinal direction but also with a certain lateral offset.

As is visible in FIG. 2, the contact strips of the additional base plate 3 can project above the height of the contact strips 5a, 5b of the base backplane 1, with only a corresponding complementary design of the contact strips of an insertable module being necessary for proper contacting. Of course, it is also possible for the contact strips 7 to be flush with the contact strips 5a and 5b in height, or also to have a lower overall height.

If the additional backplane 3 can be inserted into a space that, as illustrated in the drawing, is constructed as an intermediate space between an upper and a lower contact strip 5a and 5b, then the distribution of the load is advantageously improved in this type of subdivision, so that when a module is inserted into a contact strip 5a, 5b with optional additional contact strip 7 of the additional back plane 3, the forces and pressures that arise or take effect in this case lead more uniformly to a symmetrical distribution, and mechanical damage, particularly to the contacts 13, the contact strip 7 and the contacts 11 of the contact strips 5a, 5b can be avoided.

As represented in FIG. 1, the contact strips 7 with their contacts 13 in the form of contact pins, for instance, can have a different shape than the contact strips 5a, 5b with their contacts 11, which are likewise implemented as contact pins in this example.

In this way, for example, new plug standards or a new plug connector generation can be implemented by using an appropriately configured additional backplane 3, without the base backplane itself having to be laboriously removed from the mounting rack or the housing.

In order to keep the degrees of freedom for future developments as large as possible, only the basic functionality of the system is satisfied or reserved by the base backplane 1 or its contact strips 5a, 5b in the preferred embodiment of the invention, so that all requirements that are not needed for the basic functionality and that simultaneously imply high expense can be omitted and accordingly need not be reserved. By using an optional additional backplane 3, both cost-intensive functionalities that only a limited number of customers require, and functionalities that were not known at the time of the development, can be allowed for.

As is evident from FIGS. 1 and 2, the additional backplane 3 can be inserted and detached in the same direction as the modules or insertion cards that can be inserted into a respective contact strip 5a, 5b, and optionally into the contact strip 7. This advantageously ensures that the additional backplane 3 can be installed and again removed in a simple manner, for example, from the front side in the modular carrier. Accordingly, subsequent installation and/or retrofitting is also possible in a simple manner without the mounting rack having to be disassembled in a laborious manner, for instance, for an access from the back.

Due to the provision of additional backplanes, the possibility provided by the invention of producing several mounting rack versions, in a customer-independent manner without the previously necessary high expense, is particularly advantageous The invention is of course not restricted to the embodiment presented in the drawing, so that instead of doubling up the additional backplane 3 on a base backplane 1, for example, other insertion options are also conceivable. For example, a depression of the appropriate size can be provided in the surface of back baseplane 1 in the free space between the contact strips 5a, 5b by means of milling, for example, so that the additional backplane 3 can be recessed in part or completely in this depression.

Moreover, it goes without saying that, apart from the illustrated screw connection 9, any desired mounting means is conceivable, with catch tabs, clips, springs and so on being conceivable, that allows at least a one-time insertion, preferably a non-destructive detachment of the additional backplane 3 with respect to the mounting elements.

The invention claimed is:

1. A base backplane for an electronic mounting rack comprising:
   a support substrate;
   several contact strips for contacting modules in the form of plug-in cards present on the support substrate;
   wherein the base backplane includes a free space formed by the support substrate, the free space constructed as at least one intermediate space in a longitudinal direction of the contact strips and adapted to receive an additional backplane having several contact strips for contacting modules in the form of plug-in cards; and wherein the contact strips of the additional backplane are complementary to the contact strips of a module to be contacted, so that upon insertion of said module into the mounting rack, first selected complementary contact strips of the module are electrically connected to selected corresponding ones of the contact strips of the base backplane and second selected complimentary contact strips of the module are electrically connected to selected corresponding ones of the contact strips of the additional backplane.

* * * * *